United States Patent
Jedlowski et al.

(10) Patent No.: US 8,977,526 B1
(45) Date of Patent: Mar. 10, 2015

(54) NUCLEAR POWER PLANT CONTROL ROOM SIMULATOR

(75) Inventors: Andrew Jedlowski, Naperville, IL (US); David A. Smith, Channahon, IL (US); Andrew C. Dickson, Lisle, IL (US)

(73) Assignee: Exelon Generation Company, LLC, Kennett Square, PA (US)

( * ) Notice: Subject to any disclaimer, the term of this patent is extended or adjusted under 35 U.S.C. 154(b) by 805 days.

(21) Appl. No.: 12/699,140

(22) Filed: Feb. 3, 2010

Related U.S. Application Data

(60) Provisional application No. 61/150,493, filed on Feb. 6, 2009.

(51) Int. Cl.
*G06G 7/48* (2006.01)

(52) U.S. Cl.
USPC .............................................................. 703/6

(58) Field of Classification Search
USPC .......... 703/6, 17, 18; 701/2, 16, 33.2; 434/38, 434/29; 706/52; 700/292, 9, 292.9; 340/56; 702/182; 345/1.1; 715/219; 726/3; 361/679.31
See application file for complete search history.

(56) References Cited

U.S. PATENT DOCUMENTS

| | | | | |
|---|---|---|---|---|
| 5,235,493 | A * | 8/1993 | Yu | 361/679.31 |
| 5,367,298 | A * | 11/1994 | Axthelm | 341/22 |
| 5,916,287 | A * | 6/1999 | Arjomand et al. | 701/33.2 |
| 6,492,901 | B1 * | 12/2002 | Ridolfo | 340/506 |
| 2002/0133325 | A1 * | 9/2002 | Hoare et al. | 703/17 |
| 2004/0078094 | A1 * | 4/2004 | Nagatsuka et al. | 700/9 |
| 2004/0232323 | A1 * | 11/2004 | Bosco et al. | 250/253 |
| 2006/0114171 | A1 * | 6/2006 | Vascotto et al. | 345/1.1 |
| 2006/0160049 | A1 * | 7/2006 | Zora | 434/29 |
| 2006/0206246 | A1 * | 9/2006 | Walker | 701/16 |
| 2008/0021675 | A1 * | 1/2008 | Fehr et al. | 702/182 |
| 2008/0064013 | A1 * | 3/2008 | Quimper et al. | 434/38 |
| 2008/0235767 | A1 * | 9/2008 | Kelly | 726/3 |
| 2009/0271169 | A1 * | 10/2009 | Minto et al. | 703/18 |
| 2009/0276105 | A1 * | 11/2009 | Lacaze et al. | 701/2 |
| 2010/0100251 | A1 * | 4/2010 | Chao et al. | 700/292 |
| 2010/0205138 | A1 * | 8/2010 | Zhang et al. | 706/52 |
| 2010/0262900 | A1 * | 10/2010 | Romatier et al. | 715/219 |

OTHER PUBLICATIONS

Wikipedia free encyclopedia, Pico-ITX, 2007.*
Wang et al., "Piezo-Electric driver of ultrasonic motor on humanoid robot", IEEE 2008.*
Chinn, "CBS Studio control-console and control-room design", Proceedings of the IRE and Wave and Electronics, 1946.*
Anand et al., "Characterization of Alien-Next in 10GBase-T systems", IEEE 2005.*
Louridas, "Declarative GUI Programming in Microsoft Windows", IEEE 2007.*

(Continued)

*Primary Examiner* — Kandasamy Thangavelu
(74) *Attorney, Agent, or Firm* — Ballard Spahr LLP

(57) ABSTRACT

A system is provided for simulating an operating environment of a power plant control room (e.g., a nuclear power plant control room). The system may include a simulator configured to simulate the operating environment of the control room, and a simulation computer in communication with the simulator, wherein the simulation computer may be configured to perform a plurality of real-time calculations associated with modeling the operating environment of the control room. The simulator and the simulation computer may include only standard off-the-shelf components.

22 Claims, 2 Drawing Sheets

(56) References Cited

OTHER PUBLICATIONS

Figure 1:
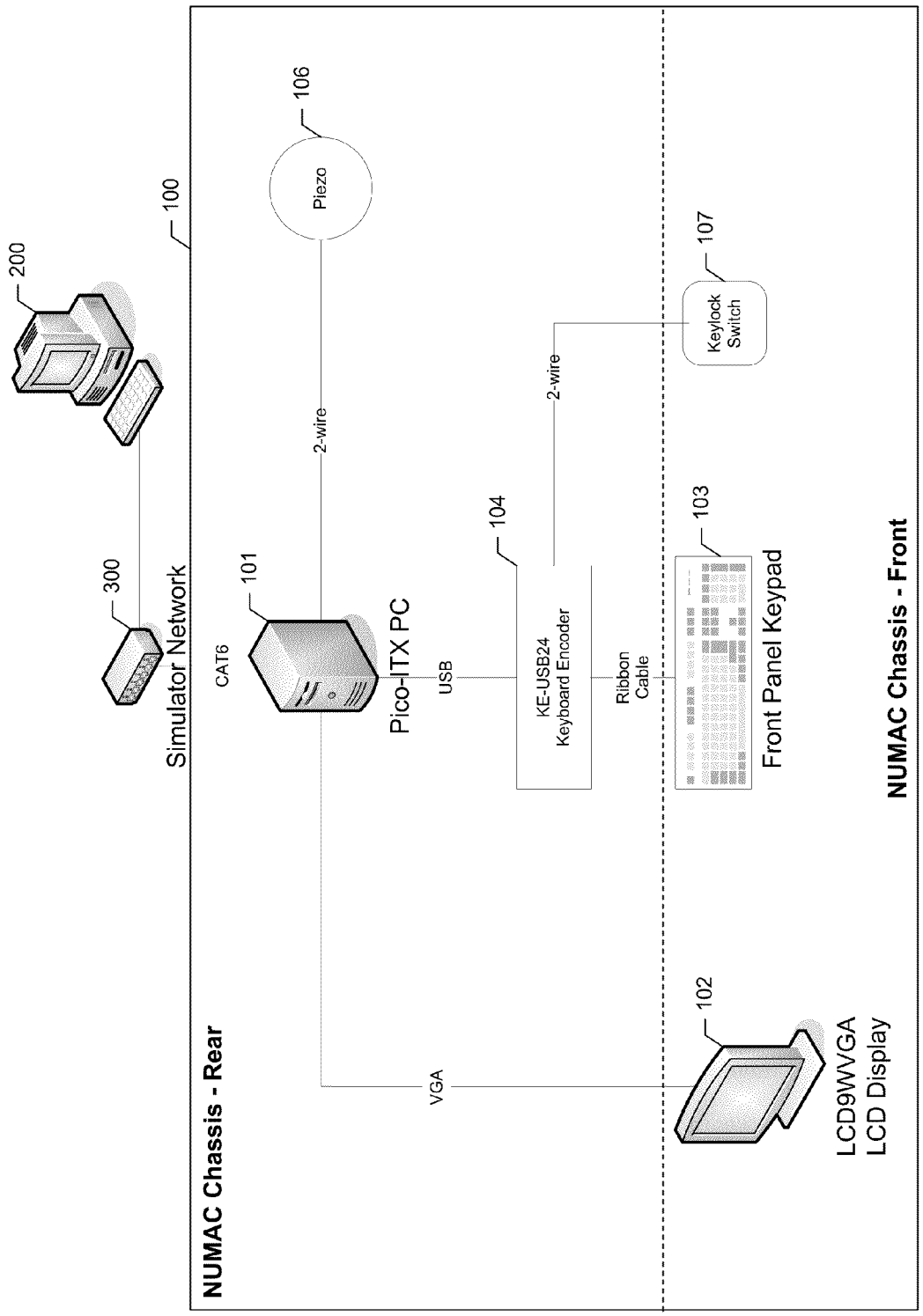

Heffley, AmerGen, Clinton Power Station, letter dated Mar. 29, 2001 to Director of Nuclear Reactor Regulation, USNRC—Attachment 1, Exemption Request.*

The Detroit Edison Company, FERMI 2 Nuclear Power Plant Control Room Simulator four year report, End of year 2000.*

Carter et al., "Nuclear Power Plant Trainirg Sijiiulator Fidelity Assessment", Oak Rld~e NaticDaJ Laboratory, Oct. 1985.*

Oak Ridge National Laboratory, "Proceedings of the Ninth Symposium on the Training of Nuclear Facility Personnel", Apr. 1991.*

Definition: Keylock switch. The Free Dictionary. <http://www.encyclopedia2.thefreedictrionary.com/keylock+switch> Accessed Mar. 17, 2014. (1 page).

U.S. NRC Regulations, 10 CFR § 55.46 Simulation facilities (2 pages).

U.S. NRC, Regulatory Guide 1.149—Nuclear Power Plant Simulation Facilities for Use in Operator Training and License Examinations (5 pages).

* cited by examiner

US 8,977,526 B1

NUCLEAR POWER PLANT CONTROL ROOM SIMULATOR

CROSS REFERENCE TO RELATED APPLICATIONS

This application claims the benefit of U.S. Provisional Application Ser. No. 61/150,493, entitled "Nuclear Power Plant Control Room Simulator," filed Feb. 6, 2009, the contents of which are hereby incorporated by reference in their entirety.

FIELD

Embodiments described herein relate, generally, to simulators and, in particular, to simulators that can be used in, among other places, a nuclear power plant control room.

BACKGROUND

Nuclear Measurement Analysis and Control (NUMAC) refers to the monitoring and control of various processes of a nuclear power plant (e.g., monitoring and controlling radiation, temperature, power ranges, etc.). Various pieces of equipment, referred to hereinafter as "NUMAC equipment," may be used to perform these monitoring activities within a nuclear power plant's control room. Due to the complexity and the level of importance associated with the NUMAC equipment, it may be desirable, if not mandatory, to train individuals to use the equipment properly and to respond to different scenarios as they occur. As a result, simulated NUMAC equipment may be provided. However, the equipment needed to create this simulated environment can be quite costly. In addition there are various regulations that the equipment must satisfy, such as those outlined in the NRC Regulatory Guide §1.149, as well as the applicable ANSI (American National Standards Institute) simulator standard.

Throughout the years, different simulator vendors have made available various simulated NUMAC hardware. One issue with these solutions has been hardware obsolescence and ongoing maintenance. For example, gas plasma displays, which are frequently used in simulated NUMAC hardware solutions provided, can be especially problematic, often failing at a rate of about one a year. In addition, some of the solutions provided include custom-built processor boards. These solutions further run on customized operating platforms and use custom-designed software to build the displays. These solutions also pose issues in relation to interchangeability of components and cost.

A need, therefore, exists for a simulator that can be used in, among other places, a nuclear power plant control room that overcomes these and other issues.

BRIEF SUMMARY

In general, embodiments of the present invention provide an improvement by, among other things, providing systems and software for simulating the operating environment of a nuclear power plant control room using off-the-shelf equipment that is less expensive and easily replaceable and interchangeable.

According to one aspect, a system is provided for simulating an operating environment of a power plant control room (e.g., a nuclear power plant control room). In one embodiment, the system may include a simulator configured to simulate the operating environment of the control room, and a simulation computer in communication with the simulator, wherein the simulation computer may be configured to perform a plurality of real-time calculations associated with modeling the operating environment of the control room. The simulator and the simulation computer may include only standard off-the-shelf components.

BRIEF DESCRIPTION OF THE SEVERAL VIEWS OF THE DRAWING(S)

Figure 2:
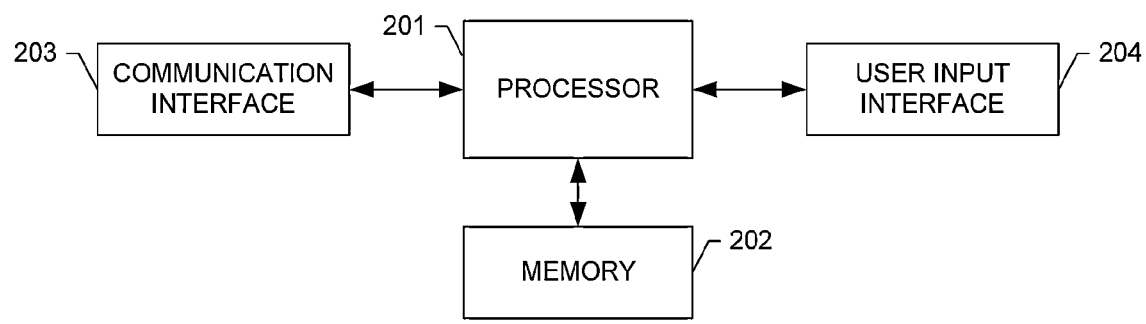

Having thus described embodiments of the invention in general terms, reference will now be made to the accompanying drawings, which are not necessarily drawn to scale, and wherein:

FIG. 1 is a block diagram of one type of system that would benefit from embodiments described herein; and FIG. 2 is a block diagram of a computing device in accordance with embodiments described herein.

DETAILED DESCRIPTION

Embodiments of the present invention now will be described more fully hereinafter with reference to the accompanying drawings, in which some, but not all embodiments of the inventions are shown. Indeed, embodiments of the invention may be embodied in many different forms and should not be construed as limited to the embodiments set forth herein; rather, these embodiments are provided so that this disclosure will satisfy applicable legal requirements. Like numbers refer to like elements throughout.

Referring to FIG. 1, an illustration of one type of system that would benefit from embodiments of the present invention is provided. As shown in FIG. 1, the system can include one or more simulators 100 connected to one or more simulation computers 200 via a simulator network 300. In one embodiment, the simulator 100 can comprise a computing device 101 (discussed in more detail below with regard to FIG. 2) configured to simulate the operating environment of a nuclear power plant control room. In particular, the computing device 101 may be configured to simulate NUMAC equipment used to monitor and control various processes in a nuclear power plant, such as radiation, temperature, power range, and/or the like. As shown in FIG. 1, in one embodiment, the computing device 101 may comprise a Pico-ITX system based on the VIA PX10000G pico ITX motherboard (referred to hereinafter as "Pico-ITX PC"). The Pico-ITX PC is relatively inexpensive, small in size, and provides flexibility to run different operating systems (e.g., XP, CE, LINUX, etc.). In addition, the Pico-ITX PC includes Video Graphic Array (VGA), 10/100 NIC (network card), and 4 Universal Serial Bus (USB) 2.0 ports, as well as audio in/out jacks.

As shown, the computing device 101 may be connected to a display monitor 102 for displaying information to a user. In general, the information displayed can mirror, or at least closely resemble, the information likely to be displayed in a real-life scenario as various events occur and inputs are received from the user. For example, the display monitor 102 may be configured to display an image that is the same, or similar, to that seen by an operator of actual NUMAC equipment when radiation is detected somewhere in a nuclear power plant. In one embodiment, the display monitor 102 may comprise a standard video graphics array (VGA) liquid crystal display (LCD) monitor, such as the open-frame 9" wide VGA (WVGA) display from AcceleVision (i.e., "LCD9WVGA"), connected to the computing device 101 via the VGA port. Use of a standard VGA LCD can provide flexibility to replace the display with new display technology as it is improved and to enable use of a standard PC to drive the display.

The computing device 101 can further be connected to a keypad 103, or similar user input device, for receiving input from a user. In general, the input device can enable a user to input the same, or similar, types of information in the same, or similar, format he or she would be likely to input in a real-life scenario being simulated. In one embodiment, the keypad 103 can be connected to the computing device 101 via a USB keyboard encoder 104, such as the KE-USB24 from Hagstrom Electronics. According to one embodiment, the keyboard encoder 104 can turn the NUMAC front panel keypad 103 into a USB keyboard, simplifying software development.

In addition to the foregoing, in order to cause the simulator 100 to look, sound and feel as much like actual NUMAC equipment as possible, the simulator 100 may further include a Piezo 106, as well as a Keylock Switch 107 connected to the computing device 101 either directly (as shown with respect to the Piezo 106) or via a keyboard encoder (as shown with respect to the Keylock Switch 107). In one embodiment, the Piezo 106 can be configured to output a beep, horn, or other similar sound effect, in response to the detection of some parameter and/or the receipt of some input from the operator or user. The Keylock Switch 107 can comprise a two-position switch, similar to that associated with actual NUMAC equipment, that can be adjusted to change the mode of the overall system, for example, from "operate" to "in-op" mode, or vice versa.

Over time, the exact components used in the design of the simulator 100 may not be available, and/or other components may become more desirable. Having to redesign the case or shelving used to store and display the simulator 100 each time a new component is introduced could be both time consuming and expensive. As a result, the front plate and back shelving of the simulator 100 of embodiments described herein was designed with flexibility in mind. In particular, according to one embodiment, a perforated shelf and wide spaced studs may be used on the back of the front plate in order to allow for a variety of different equipment to be easily mounted to the back of the simulator chassis without major rework. For example, the studs on the front panel may allow for slightly larger or smaller LCD displays to be used by changing the size/shape of the mounting bars. Similarly, the perforated shelf may allow for different devices to be mounted using existing device mounting holes (if available), tie wraps and/or other customer mounting hardware.

According to one embodiment, in order to simulate the environment of a nuclear power plant control room, the computing device 101 of the simulator 100 may be further connected to one or more simulation computers (or similar electronic devices) 200 associated with a simulator network 300. In one embodiment, the connection to the simulator network 300 may be via a category 6 (CAT6), or similar, cable. In one embodiment, the simulation computer 200 can be configured to perform various real-time calculations associated with modeling the nuclear power plant environment. The calculations may be performed in response to a user input received by the computing device 101 (e.g., via the keypad 103) and transmitted to the simulation computer 200. The results of these calculations may, thereafter, be transmitted to the computing device 101 of the simulator 100, such that the computing device 101 can take some action accordingly (e.g., cause a display and/or alarm to be generated, etc.).

In other words, according to embodiments described herein, the simulator 100 may act as an interface between the user and the simulation computer 200, wherein the simulator 100 receives user inputs and provides various outputs to the user (e.g., via the display screen or Piezo), and the simulation computer 200 performs any necessary calculations.

Referring to FIG. 2, a block diagram of a computing device 101 according to one embodiment is provided. In general, the computing device 101, which can comprise a server, personal computer (PC), laptop, and/or the like, can include various means for performing one or more functions in accordance with embodiments described herein, including those more particularly described herein. It should be understood, however, that the computing device 101 may include alternative means for performing one or more like functions, without departing from the spirit and scope of embodiments described herein. In particular, the computing device 101 can generally include means, such as a processor 201, or similar processing apparatus, for performing or controlling the various functions of the computing device 101. For example, the processor 201 may be configured to simulate certain scenarios associated with a nuclear power plant control room. In particular, according to one embodiment, the processor 201 may be configured to generate and display (e.g., on the LCD display monitor 102) the display screen an individual may see if a heightened level of radiation is detected. The processor 201 may further be configured to then receive as an input (e.g., via the keypad 103) the trainee's response to the detected heightened level, and to take some action accordingly (e.g., acknowledge an alarm associated with the heightened level). To further illustrate, if, for example, an operator is performing a simulation wherein the simulator 100 is faulty or providing false information, and he or she needs to place the simulator 100 in "in-op" mode. To do so, the operator may switch the KeyLock Switch 107 from "operate" to "in-op" mode. In this example, the processor 201 may be configured to receive an indication that the KeyLock Switch 107 has been switched, generate a display indicating that the simulator 100 is in "in-op" mode, and transmit a signal to the simulation computer 200 also indicating that the simulator 100 is in "in-op" mode.

In one embodiment, the processor 201 can be in communication with or include memory 202, such as volatile and/or non-volatile memory that stores content, data or the like. For example, the memory 202 may store content transmitted from, and/or received by, the entity. Also for example, the memory 202 may store software applications, instructions or the like for the processor 201 to perform steps associated with operation of the computer device 101 in accordance with embodiments described herein. For example, the memory 202 may store software instructions for the processor 201 to perform the steps described above for simulating the operating environment of a nuclear power plant control room.

According to one embodiment, the memory 202 may store computer program instructions and data associated with the Windows XP, or similar, operating system. In addition, according to one embodiment, the memory 202 may further store display and logic software developed, for example, based on Visual Basic.NET. Use of Visual Basic.NET for development of display and logic software can allow for easy development of NUMAC screens and logic. In addition, because the platform is the same as that used in standard PC's, displays can be developed and tested on a standard PC without having NUMAC hardware.

In addition to the memory 202, the processor 201 can also be connected to at least one interface or other means for displaying, transmitting and/or receiving data, content or the like. In this regard, the interface(s) can include at least one communication interface 203 or other means for transmitting and/or receiving data, content or the like, as well as at least one user interface 204 that can include a display (e.g., display monitor 102) and/or a user input interface. The user input interface, in turn, can comprise any of a number of devices allowing the entity to receive data from a user, such as a keypad (e.g., front panel keypad 103), a touch display, a joystick or other input device. In one embodiment, User Datagram Protocol (UDP) multicast group can be used to transfer data to and/or from the computing device 101. This may result in an easier expandability from both the simulator interface side and the physical network setup and installation.

CONCLUSION

Based on the foregoing, embodiments described herein provide a system for simulating the operating environment of a nuclear power plant control room that uses a hardware platform that is much simpler than other systems available, all off-the-shelf parts that can be easily interchanged and replaced, and user-servable connections between components can be user servable.

Hardware components of embodiments described herein may have a lifecycle that can be supported for the remaining life of the nuclear, or other, plants in which they are used. In addition, according to embodiments described herein, LCD monitors and/or PC's incorporated into the system can be replaced with new hardware as the existing hardware become obsolete, without changing the underlying architecture. This is in contrast to components of a customer vendor board, wherein if the component becomes unavailable, the customer board may have to be redesigned to work with new components. In addition, embodiments described herein eliminate the need to rely on the vendor to repair or replace custom hardware.

As described above and as will be appreciated by one skilled in the art, embodiments of the present invention may be configured as a system or computing device. Accordingly, embodiments of the present invention may be comprised of various means including entirely of hardware, entirely of software, or any combination of software and hardware. Furthermore, embodiments of the present invention may take the form of a computer program product on a computer-readable storage medium having computer-readable program instructions (e.g., computer software) embodied in the storage medium. Any suitable computer-readable storage medium may be utilized including hard disks, CD-ROMs, optical storage devices, or magnetic storage devices.

Embodiments of the present invention have been described above with reference to block diagrams and flowchart illustrations of methods, apparatuses (i.e., systems) and computer program products. It will be understood that each block of the block diagrams and flowchart illustrations, and combinations of blocks in the block diagrams and flowchart illustrations, respectively, can be implemented by various means including computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks.

The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A system for simulating an operating environment of a power plant control room comprising:
a simulator configured to simulate the operating environment of a power plant control room; and
a simulation computer in communication with the simulator, the simulation computer configured to perform a plurality of real-time calculations associated with modeling the operating environment of the power plant,
wherein the simulator comprises a plurality of hardware components, wherein the simulation computer comprises a plurality of hardware components, and wherein the hardware components of the simulator and the simulation computer cooperate to define a hardware platform of the system,
wherein each hardware component of the hardware platform is a standard off-the-shelf component, and
wherein the simulator and the simulator computer satisfy at least one of:
(a) the regulations of NRC Regulatory Guide §1.149; and
(b) applicable American National Standards Institute (ANSI) simulator standards.

2. The system of claim 1, wherein the simulator is further configured to simulate the operating environment of a nuclear power plant control room.

3. The system of claim 1, wherein the simulator further comprises a Pico-ITX system based on a VIA PX10000G pico ITX motherboard.

4. The system of claim 1, wherein the simulator further comprises a monitor configured to display information similar to information likely to be displayed in a power plant control room.

5. The system of claim 4, wherein the monitor comprises a standard video graphics array liquid crystal display monitor.

6. The system of claim 1, wherein the simulator further comprises a Piezo.

7. The system of claim 1, wherein the simulator further comprises a keylock switch.

8. The system of claim 7, wherein the key-lock switch further comprises a two-position switch associated with a mode of operation of the simulator.

9. The system of claim 1, wherein the simulator is configured to receive input from a user and to transmit the user input to the simulation computer.

10. The system of claim 9, wherein in order to perform the plurality of calculations, the simulation computer is further configured to perform the plurality of calculations based at least in part on the user input.

11. The system of claim 10, wherein the simulation computer is further configured to transmit one or more results of the plurality of calculations to the simulator.

12. The system of claim 11, wherein the simulator is further configured to generate an output to the user based at least in part on the one or more results.

13. The system of claim 1, wherein the simulator and the simulation computer are in communication via a category 6 (CAT6) cable.

14. The system of claim 1, wherein the simulator further comprises memory configured to store display and logic software developed based on Visual Basic.NET.

15. The system of claim 1, wherein the simulator has a front plate, and wherein the front plate is configured to permit adjustable mounting of at least one hardware component of the hardware platform to the front plate.

16. The system of claim 1, wherein the simulator has back shelving, and wherein the back shelving is configured to permit adjustable mounting of at least one hardware component of the hardware platform to the back shelving.

17. The system of claim 1, wherein the simulator and the simulator computer satisfy both:
(a) the regulations of NRC Regulatory Guide §1.149; and
(b) applicable American National Standards Institute (ANSI) simulator standards.

18. A system for simulating an operating environment of a power plant control room comprising:
a simulator comprising a plurality of hardware components;
a simulation computer comprising a plurality of hardware components;
wherein the hardware components of the simulator and the simulation computer cooperate to define a hardware platform of the system,
wherein each hardware component of the hardware platform is a standard off-the-shelf component;
the simulator comprising:
a computing device having a processor configured to simulate the operating environment of a power plant control room;
a display monitor in communication with the computing device, the display monitor comprising a standard video graphics array (VGA) liquid crystal display (LCD) monitor;
a user input device in communication with the computing device, the user input device being connected to the computing device via a USB keyboard encoder;
a Piezo in communication with the computing device, the Piezo being configured to produce a sound effect in response to at least one of a detected parameter and an input received from a user; and
a keylock switch in communication with the computing device, wherein the keylock switch is configured to permit selective adjustment of the mode of the system between an "operate" mode and an "in-op" mode; and
the simulation computer in communication with the simulator via a category 6 (CAT6) cable, the simulation computer configured to perform a plurality of real-time calculations associated with modeling the operating environment of the power plant, wherein at least one real-time calculation of the plurality of real-time calculations is performed in response to a user input received by the computing device of the simulator, and wherein the results of the plurality of real-time calculations are transmitted to the computing device of the simulator,
wherein the simulator is configured to cause a corresponding action in response to receipt of the results of the plurality of real-time calculations, and
wherein the simulator and the simulator computer satisfy at least one of:
(a) the regulations of NRC Regulatory Guide §1.149; and
(b) applicable American National Standards Institute (ANSI) simulator standards.

19. The system of claim 18, wherein the processor of the simulator is configured to generate and display a display screen corresponding to the display screen displayed in a power plant control room when a heightened level of radiation is detected.

20. The system of claim 19, wherein processor of the simulator is configured to receive a user input in response to the simulated detected heightened level of radiation.

21. The system of claim 18, wherein the simulator comprises a memory in communication with the processor of the computing device, and wherein the memory stores computer program instructions and data associated with the WINDOWS operating system, and wherein the memory stores display and logic software developed based on Visual Basic.NET.

22. The system of claim 18, wherein the simulator and the simulator computer satisfy both:
(a) the regulations of NRC Regulatory Guide §1.149; and
(b) applicable American National Standards Institute (ANSI) simulator standards.

* * * * *